United States Patent [19]
Sandoh et al.

[11] Patent Number: 5,160,997
[45] Date of Patent: Nov. 3, 1992

[54] SEMICONDUCTOR INTEGRATED CIRCUIT WITH SHIELD ELECTRODES FOR PROTECTING THE INTERCONNECTION LINES FROM UNDESIRABLE RADIATION

[75] Inventors: Fumio Sandoh, Tochigi; Kazuo Tomizuka, Meiwa, both of Japan

[73] Assignee: Sanyo Electric Co., Ltd., Osaka, Japan

[21] Appl. No.: 684,471

[22] Filed: Apr. 11, 1991

Related U.S. Application Data

[63] Continuation of Ser. No. 389,179, Aug. 3, 1989, abandoned.

[30] Foreign Application Priority Data

Aug. 12, 1988 [JP] Japan ................................. 63-202199
Sep. 20, 1988 [JP] Japan ................................. 63-235829

[51] Int. Cl.$^5$ ...................... H01L 27/10; H01L 27/15
[52] U.S. Cl. .................................. 257/207; 257/211; 257/758; 257/659
[58] Field of Search ........................ 357/41, 40, 45, 47, 357/48, 84

[56] References Cited

U.S. PATENT DOCUMENTS

| | | | |
|---|---|---|---|
| 4,628,343 | 12/1986 | Komatsu | 357/48 |
| 5,050,238 | 9/1991 | Tomizuka et al. | 357/84 |
| 5,111,274 | 5/1992 | Tomizuka et al. | 357/84 |

FOREIGN PATENT DOCUMENTS

| | | | |
|---|---|---|---|
| 57195480 | 5/1984 | Japan | 357/48 |
| 60-1843 | 1/1985 | Japan | 357/48 |
| 60-35537 | 2/1985 | Japan | 357/47 |
| 60-165752 | 8/1985 | Japan | 357/40 |
| 60-154644 | 12/1985 | Japan | 357/40 |
| 62-12147 | 1/1987 | Japan | 357/47 |

Primary Examiner—Rolf Hille
Assistant Examiner—Steven Loke
Attorney, Agent, or Firm—Darby & Darby

[57] ABSTRACT

A semiconductor integrated circuit includes interconnection lines (7) between a plurality of circuit blocks (25–29) having different functions, and shield electrodes (70, 2a, 2b, 2c 3a, 3b, 3c, 5c1, 5c2, 6a1, 6a2) for protecting the interconnection lines (7) from undesirable radiation.

4 Claims, 13 Drawing Sheets

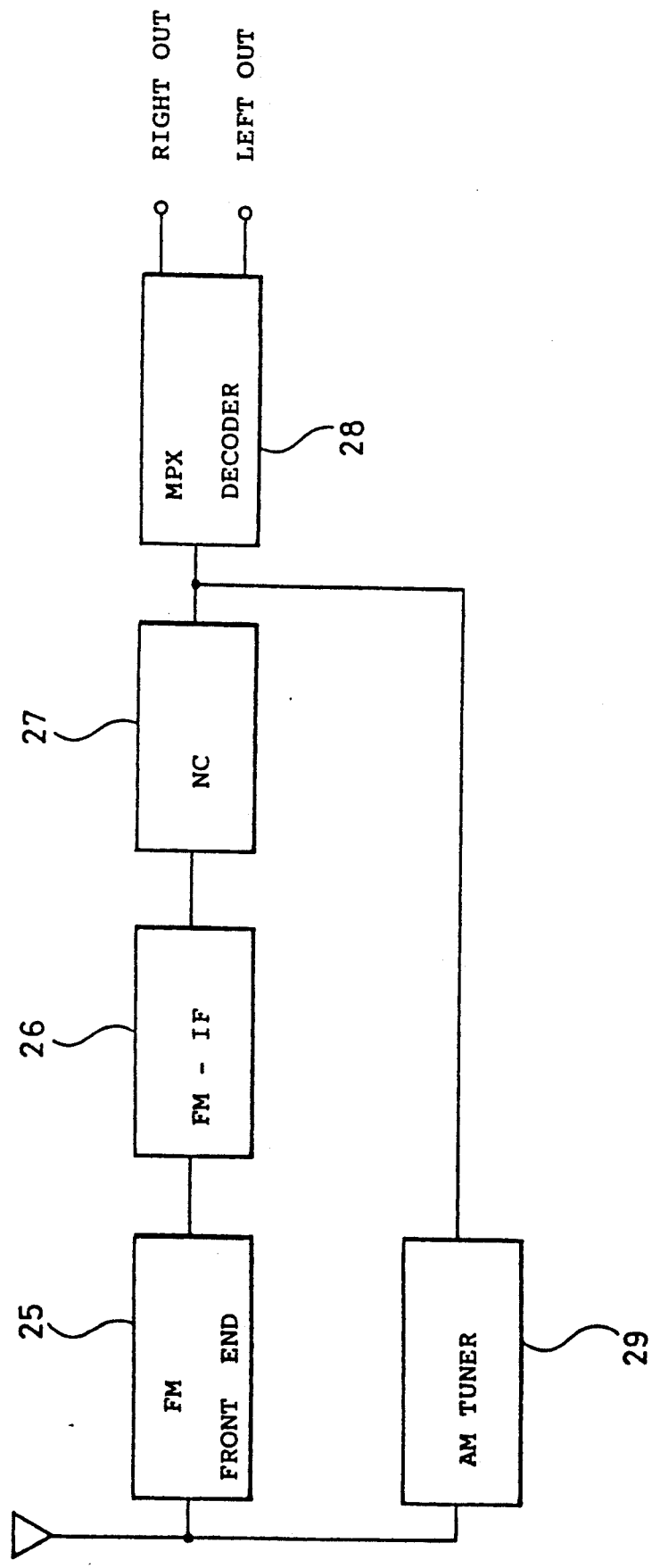

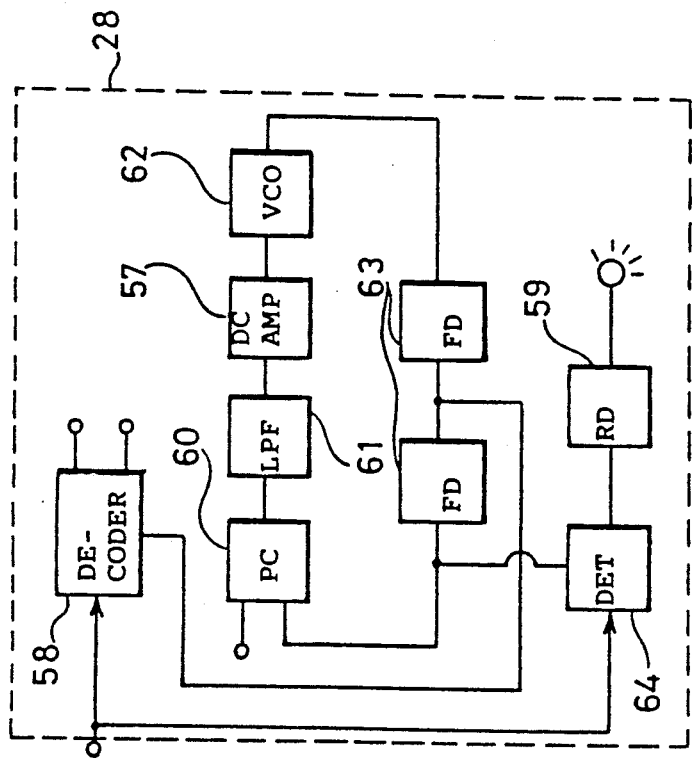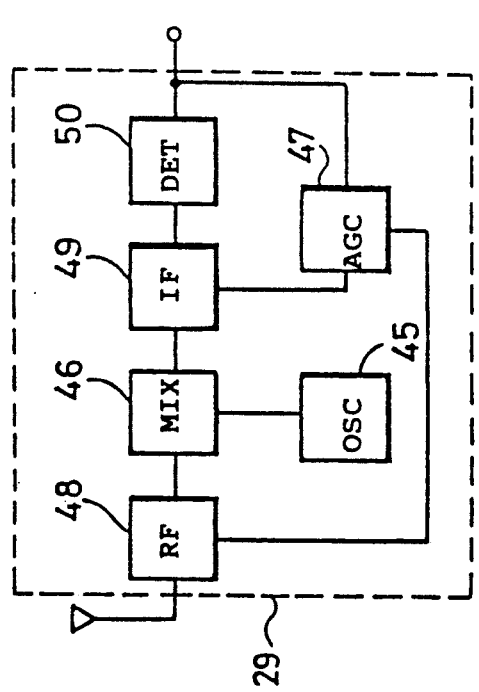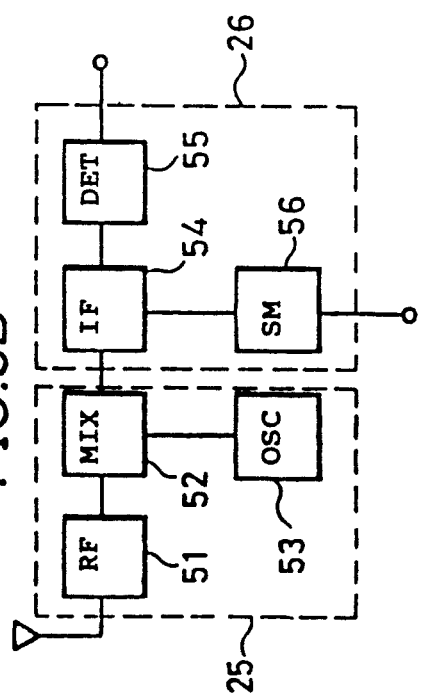

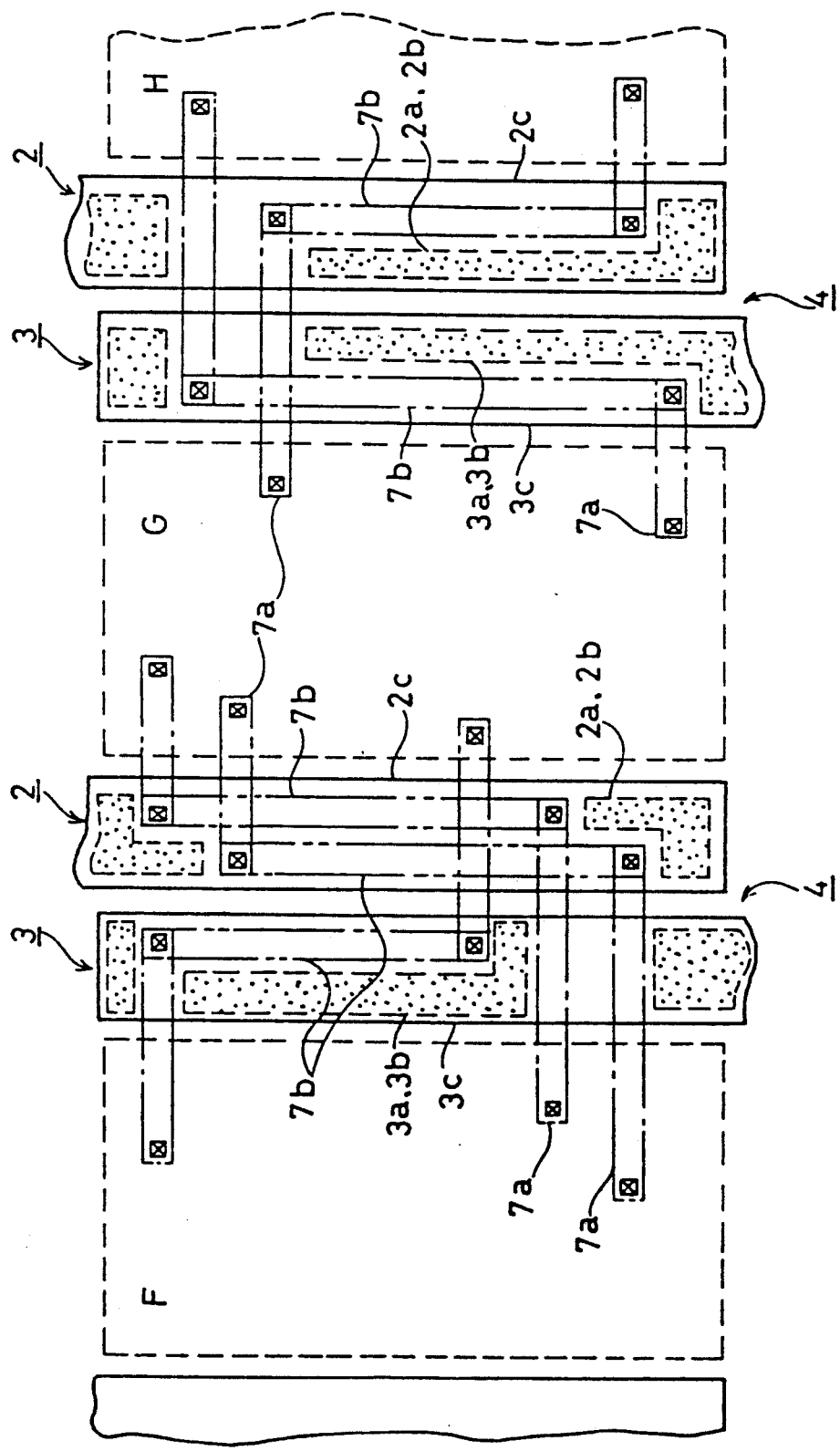

SEMICONDUCTOR INTEGRATED CIRCUIT WITH SHIELD ELECTRODES FOR PROTECTING THE INTERCONNECTION LINES FROM UNDESIRABLE RADIATION

This is a continuation of application Ser. No. 389,179, filed Aug. 3, 1989, now abandoned.

BACKGROUND OF THE INVENTION

1. Field of the Invention

The present invention relates to semiconductor integrated circuits (ICs) and particularly to an improvement in a pattern layout and a conductor structure of a semiconductor IC.

2. Description of the Background Art

FIG. 1A is a schematic top view showing an example of a pattern layout of a conventional semiconductor IC and FIG. 1B is a schematic sectional view taken along the line 1B—1B in FIG. 1A. Referring to those figures, a semiconductor chip 101 comprises circuit blocks 1a to 1f. Each of those circuit blocks is formed in an epitaxial N layer 103 on a P− semiconductor substrate 102 and surrounded by P+ isolation regions 104. The epitaxial layer 103 is covered with an oxide film 105. Ground lines 106 penetrate the oxide film 105 and they are in ohmic contact with the P+ isolation regions 104, whereby potentials of the P+ isolation regions 104 and P− substrate 102 are stably set to a ground potential.

A bundle of ground lines 106 extend from a ground bonding pad GND provided on the left of the semiconductor chip 101 through a central region of the semiconductor chip 101 and the ground lines 106 are distributed from the bundle to the corresponding circuit blocks 1a to 1f. Power supply lines extend from a power supply bonding pad Vcc provided on the right of the semiconductor chip 101 to peripheral regions of the semiconductor chip 101 so that they are connected to the corresponding circuit blocks.

In general, signals processed in the circuit blocks 1a to 1f have different frequencies and amplitude levels and those circuit blocks 1a to 1f have different functions. Thus, the circuit blocks 1a to 1f have different numbers of circuit elements and they have different areas. Accordingly, it is not easy to arrange efficiently the circuit blocks 1a to 1f having different areas in a small area. In addition, if the circuit block 1a for example is replaced by a modified circuit block (having a different area from the circuit block 1a) or a new circuit block is added, it is often necessary to rearrange all the circuit blocks 1a to 1f in order to set such a modified or new circuit block efficiently in a reduced area.

Further, in the case of arranging the circuit blocks, it is desirable to reduce the total area occupied by those circuit blocks and at the same time it is necessary to take measures to minimize undesirable mutual interferences of the circuit blocks. Consequently, for example in the case of changing part of a certain IC device in compliance with a request of a user, it is often necessary to entirely change the design of the circuit block pattern, which takes time and involves considerable cost.

Further, inter-block lines 108 such as signal lines or feedback lines between the circuit blocks might be subjected to interference due to undesirable radiation from the circuit blocks which process high-frequency signals. The inter-block lines 108 are only shown between the circuit blocks 1a and 1b in FIG. 1A for the purpose of simplification of the drawing.

In addition, it is necessary to take account of three-dimensional crossing between the inter-block lines 108, the power supply lines 107 and the ground lines 106, causing the design of the conductor pattern to be complicated.

SUMMARY OF THE INVENTION

In view of the above described prior art, an object of the present invention is to provide a semiconductor IC having a pattern layout applicable to various custom ICs.

Another object of the present invention is to provide a semiconductor IC in which interferences of circuit blocks are reduced.

A further object of the present invention is to provide a semiconductor IC having a conductor structure in which a semiconductor pattern can be easily designed.

According to an aspect of the present invention, a semiconductor IC includes: a plurality of mat regions having a substantially equal size and including a plurality of circuit elements, formed on a semiconductor chip; partition regions for separating those mats from each other; a pair of power supply line and ground line provided on each of the partition regions; inter-mat lines for interconnecting the mats; and shield electrodes for shielding the inter-mat lines. An electronic circuit formed on the semiconductor chip includes circuit blocks having different functions and it is designed by using a mat as a unit, not a circuit block as a unit.

According to another aspect of the present invention, a semiconductor IC includes: a plurality of circuit blocks having different functions, formed on a semiconductor chip; power supply lines and ground lines for supplying power to those circuit blocks; and inter-block lines for interconnecting the circuit blocks. The power supply lines include power supply lines of first and second layers contacting each other. The power supply lines of the first layer are cut at desired positions for enabling the inter-block lines of the same layer to pass therethrough. The continuity of the power supply lines is maintained by the power supply lines of the second layer. Similarly, the ground line include ground lines of first and second layers contacting each other. The ground lines of the first layer are cut at desired positions for enabling the inter-block lines of the same layer to pass therethrough. The continuity of the ground lines is maintained by the ground lines of the second layer.

According to a further aspect of the present invention, a semiconductor IC includes: a plurality of circuit blocks having different functions, formed on a semiconductor chip; power supply lines and ground lines for supplying power to the circuit blocks; and inter-block lines for interconnecting the circuit blocks. The . inter-block lines include inter-block lines of first and second layers. The power supply lines include power supply lines of first, second and third layers contacting each other. The power supply lines of the first layer are cut at desired positions for enabling the inter-block lines of the first layer to pass therethrough. The power supply lines of the second layer are cut at desired positions for enabling the inter-block lines of the second layer to pass therethrough. Similarly, the ground lines include ground lines of first, second and third layers contacting each other. The ground lines of the first layer are cut at desired positions for enabling the inter-block lines of the first layer to pass therethrough. The ground lines of the second layer are cut at desired positions for enabling the inter-block lines of the second layer to pass therethrough. Thus, 2-level crossing of the inter-block lines can be accomplished in the regions of the power supply lines and the ground lines.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a circuit block diagram showing an example of an AM/FM stereo tuner.

FIG. 5A is a sub block diagram showing details of an AM tuner block.

FIG. 5B is a sub block diagram showing details of an FM front end block and an FM-IF block.

FIG. 5C is a sub block diagram showing details of a multiplex decoder block.

FIG. 9 is a schematic partial top view of a semiconductor IC according to a further embodiment of the present invention.

DESCRIPTION OF THE PREFERRED EMBODIMENTS

Figure 2:
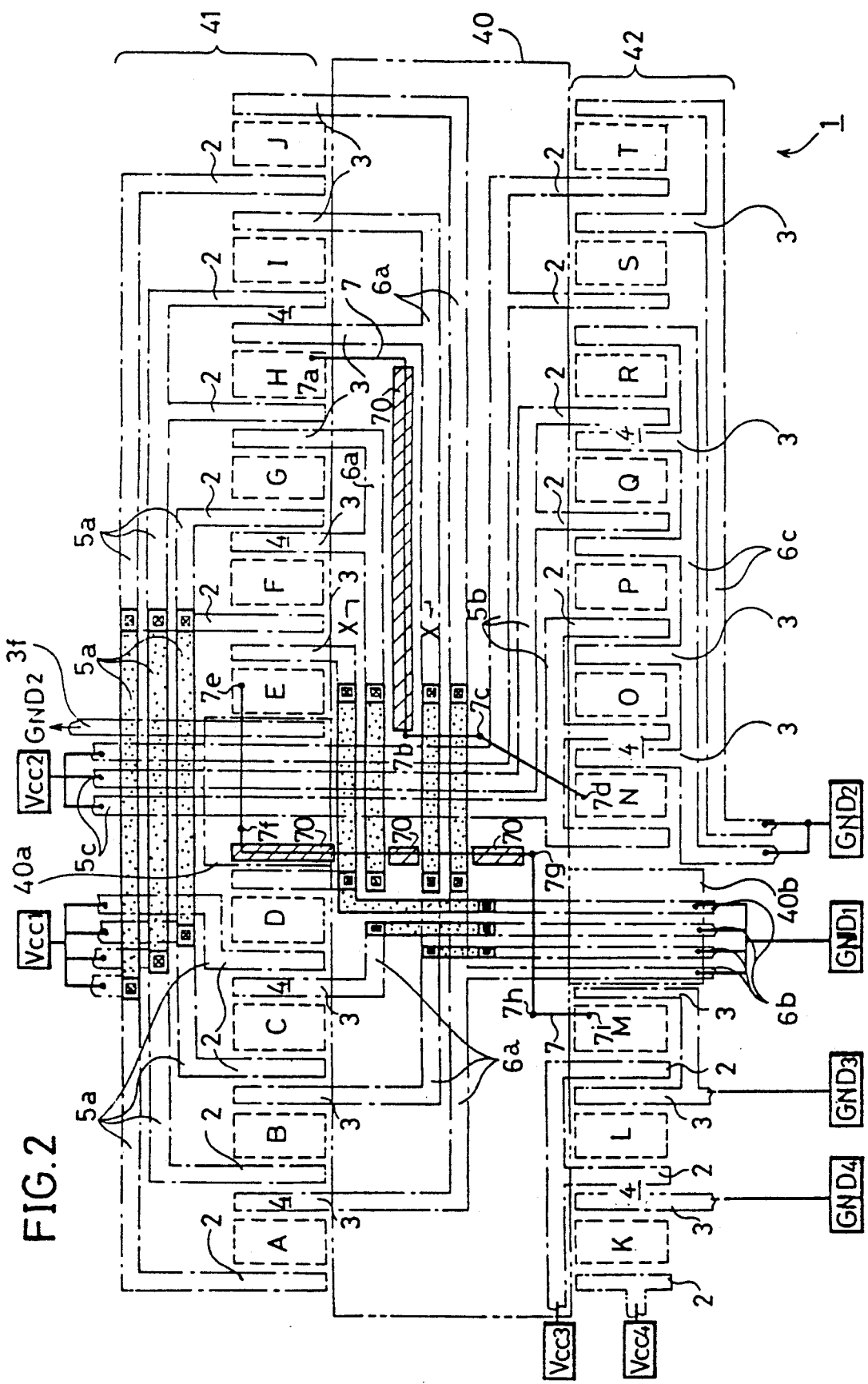
FIG. 2 is a schematic top view showing a pattern layout of a semiconductor IC according to an embodiment of the present invention.

Referring to FIG. 2, a surface pattern of a semiconductor IC according to an embodiment of the present invention is schematically shown. A semiconductor chip 1 is divided into first and second regions 41 and 42 by a division region 40 shown by the double-dot chain lines. Mats A to J separated from each other by partition belts 4 are provided on the first region 41, and a plurality of circuit elements (not shown) are formed in each of those mats A to J. Power supply lines 2 and ground lines 3 parallel to each other are normally provided on the respective partition belts 4. A power supply line 2 is provided adjacent to the left side of each of the mats A to J and a ground line 3 is provided adjacent to the right side thereof. Accordingly, only one power supply line exists on the left side of the mat A at the left end and only one ground line 3 exists on the right side of the mat J at the right end. Similarly, mats K to T are provided on the second region 42.

The first region 41 is further divided into a first sub region including the mats A to D and a second sub region including the mats E to J by a first additional division region 40a. Similarly, the second region 42 is further divided into a third sub region including the mats K to M and a fourth sub region including the mats N to T by a second additional division region 40b.

Each of the power supply line 2 extending along the mats A to J is connected to one of power supply lines of a bundle 5a extending in a horizontal direction in the figure along an upper side of the semiconductor chip 1. The bundle 5a of power supply lines is connected to a first power supply pad Vcc1. The bundle 5a of power supply lines includes conductors in a second conductor layer shown by smudged areas in order to accomplish 2-level crossing.

Each of the ground lines 3 extending along the mats A to J is connected to one of ground lines of a bundle 6a extending in the horizontal direction along an upper side of the division region 40. The bundle 6a of ground lines include conductors in the second conductor layer shown by smudged areas in order to accomplish the 2-level crossing. The bundle 6a of ground lines is connected to a first ground pad GND1 through another bundle 6b of ground lines extending in a vertical direction in the figure along the second additional division region 40b. The bundle 6b of ground lines in the vertical direction also includes conductors in the second conductor layer shown as smudged areas in order to accomplish the 2-level crossing.

Similarly, each of the power supply lines extending along the mats N to T in the second region 42 is connected to one of power supply lines of a bundle 5b extending in the horizontal direction along a lower side of the division region 40. The bundle 5b of power supply lines is connected to a second power supply pad Vcc2 through another bundle 5c extending in the vertical direction along the first additional division region 40a. Each of the ground lines 3 extending along the mats N to T is connected to one of ground lines of a bundle 6c extending in the horizontal direction along a lower side of the semiconductor chip 1. The bundle 6c of ground lines is connected to a second ground pad GND2.

If a circuit block liable to cause interference with other circuit blocks is to be formed in the mats K to M, the respective power supply lines 2 extending along the mats K to M may be connected to a third or fourth power supply pad Vcc3 or Vcc4 provided separately from the first and second power supply pads Vcc1 and Vcc2. The respective ground lines 3 extending along the mats K to M may be also connected to a third or fourth ground pad GND3 or GND4 provided separately from the first and second ground pads GND1 and GND2.

If a large number of capacitors liable to cause leakage current are to be formed in the mat E, a ground line 3f may be provided instead of the power supply line 2, along the left side of the mat E in order to absorb the leakage current. The ground line 3f extends in the clockwise direction around the semiconductor chip 1, so as to be connected to the second ground pad GND2.

The mats A to T each have the substantially same rectangular form and size. For example, a shorter side of each mat is set to a dimension making it possible to arrange six bipolar transistors. A longer side of each mat is set to a dimension making it possible for the mat to contain about 100 circuit elements, easy to handle in design. However, the mat size can be set to an arbitrary size which can contain a preferable number of circuit elements according to circuit blocks incorporated in an IC device. In FIG. 2, the mats A to T are shown on a reduced scale compared with the conductors.

Circuit elements such as transistors, diodes, resistors and capacitors can be integrated in each mat and those circuit elements are isolated from each other by normal PN junction. The circuit elements are interconnected substantially by the conductors in the first layer and partially by the conductors in the second layer to accomplish the 2-level crossing.

Figure 3A:
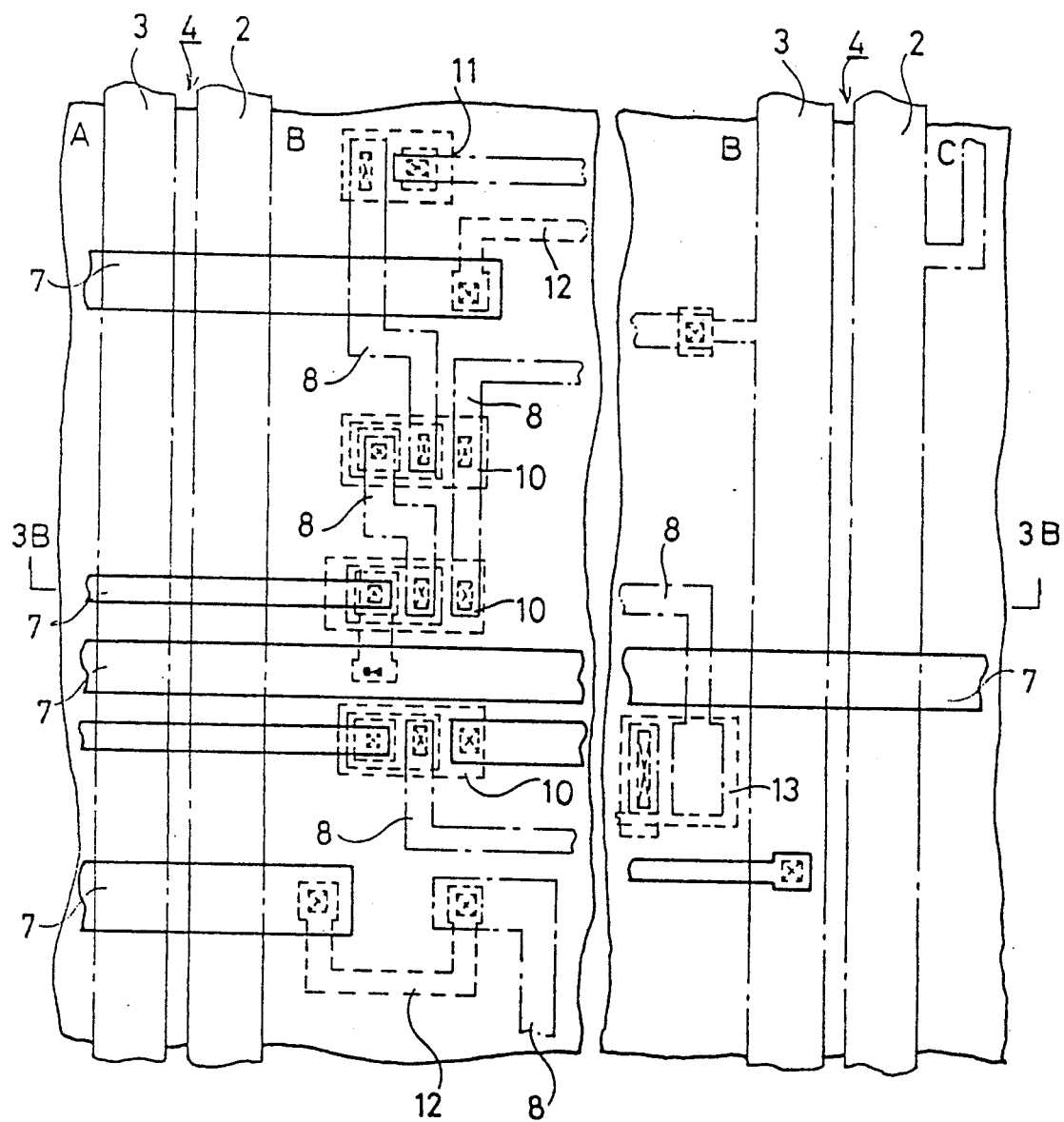
FIG. 3A is an enlarged detailed view of a part of FIG. 2.

Referring to FIG. 3A, a top view of a region near the mat B is partially shown in an enlarged manner. The power supply lines 2, the ground lines 3, and the conductors 8 for connection of the circuit elements in the mat, represented by the single-dot chain lines, exist in the first conductor layer. Inter-mat lines 7 between the mats, such as signal lines or feedback lines for example are represented by the solid lines and those lines exist in the second conductor layer. In FIG. 2, only two inter-mat lines are illustrated for the purpose of clarifying the drawing. The conductors 2, 3, 8 in the first layer and the conductors 7 in the second layer can be connected through contact regions represented by the marks x. The mat B exists between the power supply line 2 on the left side and the ground line 3 on the right side, and the circuit elements such as transistors 10, diodes 11, resistors 12 and capacitors 13 represented by the broken lines are formed in the mat B. Although those circuit elements 10 to 13 are roughly shown for the purpose of clarifying the drawing, they are in reality integrated with high density.

Figure 3B:
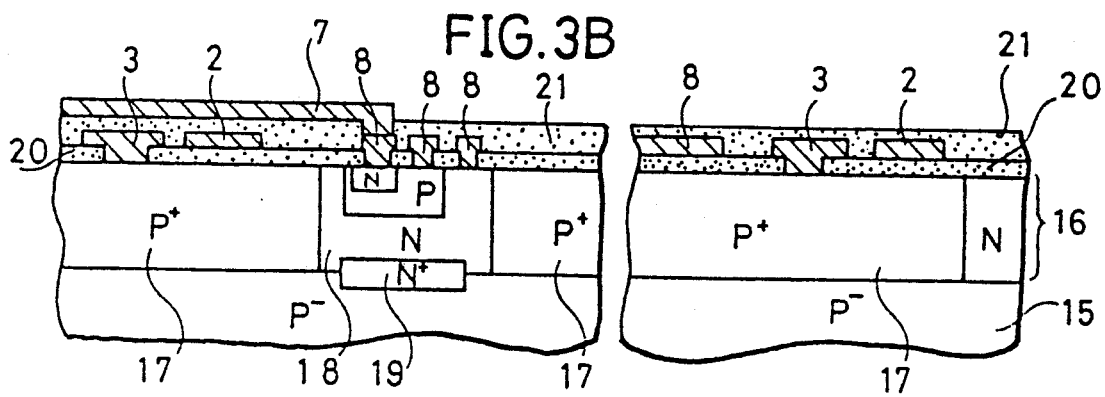
FIG. 3B is a sectional view taken along the line 3B—3B in FIG. 3A.

Referring to FIG. 3B, a sectional view taken along the line 3B—3B in FIG. 3A is schematically shown. An N epitaxial layer 16 is formed on a P⁻ semiconductor substrate 15. A large number of islands 18 surrounded by P+ isolation regions 17 are formed in the epitaxial layer 16. Each of the circuit elements such as the NPN transistors 10, the diodes 11, the resistors 12 and the capacitors 13 is formed in each one of those islands 18. A burried N+ region 19 is formed between a collector N region 18 of each NPN transistor 10 and the P⁻ substrate. The epitaxial layer 16 is covered with a silicon oxide film 20 formed by chemical vapor deposition (CVD) for example. Conductors 2, 3, 8 in the first layer are formed on the silicon oxide film 20 and those conductors are covered with an insulating film 21 of polyimide resin or the like. Conductors 7 in the second layer are formed on the insulating film 21.

The power supply lines 2 and the ground lines 3 are provided above the P+ isolation regions 17. The ground lines 3 penetrate the silicon oxide film 20 along the longitudinal direction thereof and they are in ohmic contact with the P+ isolation regions 17, so that the substrate 15 is stably set at a ground potential.

In the following, an example of a relation between the electronic circuit blocks and the mats A to T incorporated in the semiconductor chip in FIG. 2 will be described.

FIG. 4 is a circuit block diagram showing an example of an AM/FM stereo tuner. An FM front end block 25 includes about 250 circuit elements and it receives an FM broadcasting signal of several tens of MHz to several hundreds of MHz and converts it to an intermediate frequency signal of 10.7 MHz. An FM-IF block 26 includes about 430 circuit elements and it amplifies the intermediate frequency signal and detects the amplified signal so that an audio signal is obtained. A noise canceller block 27 includes about 270 circuit elements and it removes pulse noise such as ignition noise. A multiplex decoder block 28 includes about 390 circuit elements and it divides a stereo composite signal into right and left channel signals so as to output a stereo signal. An AM tuner block 29 includes about 350 circuit elements and it converts a received AM signal to an intermediate frequency signal (of 450 KHz) and detects the converted signal so that an audio output is obtained.

All the circuit blocks 25 to 29 of the AM/FM stereo tuner in FIG. 4 can be integrated in the semiconductor chip in FIG. 2. The front end block 25 including about 250 circuit elements is divided into three portions each including less than 100 circuit elements, and each of those three portions is formed in any of the mats K, L, M. The FM-IF block 26 including about 430 circuit elements are formed in the mats E, F, G, H, I. The noise canceller block 27 including about 270 circuit elements is formed in the mats N, O, P. The multiplex decoder block 28 including about 390 circuit elements is formed in the mats Q, R, S, T. The AM tuner block 29 including about 350 circuit elements is formed in the mats A, B, C, D.

Referring to FIGS. 5A, 5B and 5C, each of the AM block 29, the FM front end block 25, the FM-IF block 26 and the multiplex decoder block 28 is represented by a plurality of circuit sub blocks.

An oscillation circuit 45 in the AM tuner block 29 in FIG. 5A is formed in the mat A. A mixing circuit 46 is formed in the mat B. An automatic gain control circuit 47, a high frequency amplifying circuit 48 and an intermediate frequency amplifying circuit 49 are formed in the mat C. A detecting circuit 50 is formed in the mat D. A power supply line 2 extending along each of the mats A to D is connected to the corresponding one of the power supply lines of the bundle 5a extending along the upper side of the semiconductor chip 1 and connected to the first power supply pad Vcc1. A ground line 3 extending along each of the mats A to D is connected to the corresponding one of the ground lines of the bundle 6a extending along the upper side of the division region 40. Each ground line 6a on the division region 40 extends along the second division region 40b between the mats M and N from the first ground pad GND1 and it is connected to the corresponding one of the ground lines of the bundle 6b extending toward the division region 40.

As shown in FIG. 5B, the FM front end block 25 includes a high frequency amplifying circuit 51, a mixing circuit 52 and an oscillating circuit 53 and it processes a signal of a very low level such as several μV. Accordingly, the FM front end block 25 is liable to be adversely affected by other circuit blocks, particularly by the FM-IF block 26 and therefore the FM front end block 25 and the FM-IF block 26 are conventionally formed on different semiconductor chips. On the other hand, the oscillating circuit 53 in the FM front end block 25 might cause undesirable radiation to exert adverse effect on other circuit blocks. Therefore, the mats K to M where the FM front end block 25 is formed are sufficiently spaced in a diagonal direction of the semiconductor chip 1 from the mats E to I where the FM-IF block 26 is formed.

The oscillating circuit 53 in the FM front end block 25 is formed in the mat K in the left lower corner of the semiconductor chip 1 in order to avoid mutual interference with other circuit blocks. Further, the power supply line 2 and the ground line 3 provided for the mat K are connected to a fourth power supply pad Vcc4 and to a fourth ground pad GND4, respectively, exclusively used for the mat K in order to avoid interference with other mats. The power supply line 2 and the ground line 3 extending along each of the mats L and M are connected to a third power supply pad Vcc3 and to a third ground pad GND3, respectively.

The FM-IF block 26 includes an intermediate frequency amplifying circuit 54, a detecting circuit 55 and an S meter 56. The detecting circuit 55 is formed in the mat I and the S meter 56 is formed in the mat G. A limiter circuit, a muting circuit and the like included in the intermediate frequency amplifying circuit 54 are formed in the mats E, F, G.

The limiter circuit included in the intermediate frequency amplifying circuit 54 in the mats E to G has a very high gain of 80 dB to 100 dB. The detecting circuit 55 in the mat I and the S meter 56 in the mat H have high signal levels. Consequently, an undesirable feedback signal generated from the detecting circuit 55 and the S meter to the intermediate frequency amplifying circuit 54 might cause oscillation. Such oscillation would affect adversely the characteristics of the detecting circuit 55 and the S meter 56. Therefore, in order to prevent such adverse effect, two power supply lines 2 extending along the mats F and G including the intermediate frequency amplifying circuit 54 are connected to one of the power supply lines of the bundle 5a extending along the upper side of the semiconductor chip 1, while two power supply lines 2 extending along the mat I including the S meter 56 and along the mat H including the detecting circuit 50 are connected to another line of the bundle 5a. In addition, a power supply line 2 extending along the mat J where an optional circuit desired by the user is formed is connected to a further line of the bundle 5a.

Similarly, two ground lines 3 along the mats F and G are connected to one of the ground lines of the bundle 6a on the division region 40 and the two ground lines 3 along the mats H and I are connected to another line of the bundle 6a. The ground line 3 along the mat J is connected to a further line of the bundle 6a.

A DC amplifying circuit 57, a decoder circuit 58 and a ramp driver circuit 59 included in the multiplex decoder block 28 in FIG. 5C are formed in the mats Q and R. The remaining phase comparing circuit 60, low-pass filter 61, voltage control oscillator 62, frequency-dividing circuit 63 and detecting circuit 64 are formed in the mats S and T. The two power supply lines extending along the mats Q and R are connected to one of the power supply lines of the bundle 5b extending along the lower side of the division region 40, while the two power supply lines extending along the mats S and T are connected to another line of the bundle 5b. The three power supply lines 2 extending along the mats N, O and P including the noise canceller block are connected to a further line of the bundle 5b. Each line of the bundle 5b is connected to the corresponding one of the lower lines 5c extending from a second power line pad Vcc2 adjacent to the first power supply pad Vcc1 to the division region 40 along the first additional division region 40a between the mats D and E.

The five ground lines 3 extending along the mats N to R are connected to one of the ground lines of the bundle 6c extending along the lower side of the semiconductor chip 1 from the second ground line GND2 and the two ground lines 3 extending along the mats S and T are connected to another line of the bundle 6c.

The separate second power supply pad Vcc2 adjacent to the first power supply pad Vcc1 and the separate second ground pad GND2 adjacent to the first ground pad GND1 are provided to reduce interference between the circuit blocks. Each of the first and second power supply pads Vcc1 and Vcc2 is connected to a power supply lead (not shown) through a fine metallic wire. Consequently, even if a pulse noise occurs in either of the first and second power supply pads Vcc1 and Vcc2, the pulse noise is attenuated by impedance of the two fine metallic wires and accordingly influence on the other power supply pad can be reduced. Similarly, the first and second ground pads GND1 and GND2 are connected to a ground lead (not shown) through respective fine metallic wires.

Figure 6:
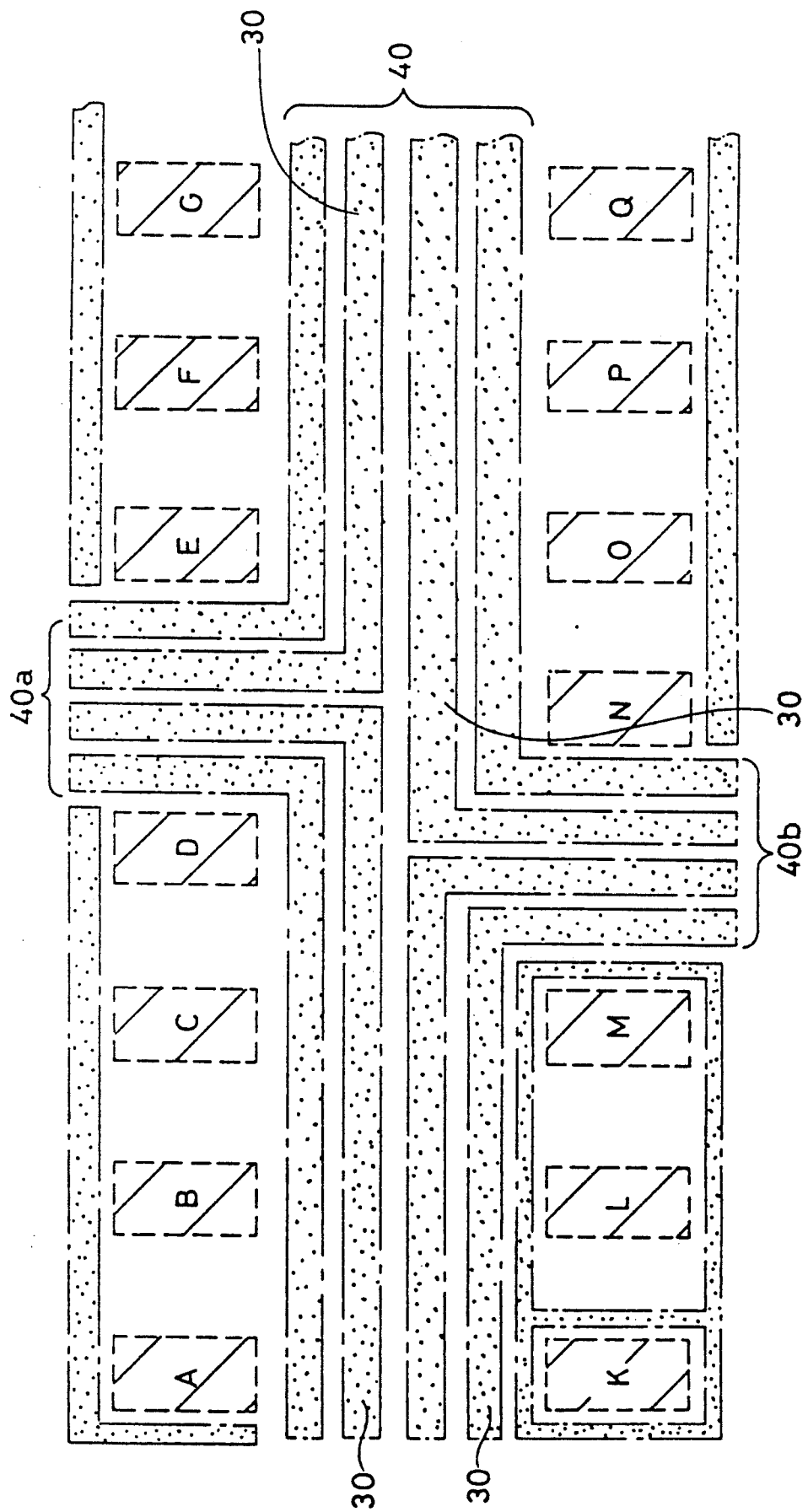
FIG. 6 is schematic top view showing an arrangement of a plurality of elongate dummy islands.

Referring to FIG. 6, a bundle 30 of elongate dummy islands is formed in the division region 40 and the first and second additional division regions 40a and 40b as illustrated in a schematic top view. The mats in this figure are shown on a relatively reduced scale. The dummy islands 30 are isolated from each other by the P+ isolation regions 17 similarly to the islands 18 in FIG. 3B, but no circuit elements are formed in the dummy islands 30. The bundle 30 of those dummy islands prevents leakage current from flowing between the division region 40 and the first to fourth sub regions divided by the first and second additional division regions 40a and 40b, by means of the PN junction barriers and it serves to prevent interference due to the leakage current between the circuit blocks formed in those sub regions. The bundle 30 in FIG. 6 includes four elongate dummy islands but it may include an arbitrary number of dummy islands.

In the semiconductor IC in FIG. 2, if the AM tuner block 29 is not required, the multiplex decoder block 28 can be shifted from the mats Q to T to the mats A to D. In that case, it is not needed to entirely change the arrangement of the circuit elements and conductors in the multiplex decoder block 28, and only the conductors between the circuit blocks need to be rearranged. Similarly, if the circuits in the mats I and J are shifted to the vacant mats Q and R, the fours mats I, J, S, T at the right end are not required and those mats can be omitted.

If an improvement is made only in the mat F of the FM-IF block 26 for example, it is only necessary to redesign the mat F without any change for the other mats and therefore a high reliability can be maintained.

In addition, if a user desires an additional circuit block in addition to the optional mat J, only a necessary number of mats need to be added.

Thus, according to the present invention, since mats of the substantially same size are arranged in a line form or a matrix form on the semiconductor chip, it is easy to change, add and delete circuit blocks as required. Accordingly, circuit blocks to be used in an electronic circuit of a large scale can be individually design and stocked. As a result, the time required for design of a large-scale electronic circuit can be considerably reduced.

In the following, the shielded inter-mat lines 7 between the mats will be described.

Referring to FIG. 2, the inter-mat lines 7 between the mats H and N, and between the mats E and M are shown by way of example. The shield electrodes 70 for shielding those inter-mat lines are shown as hatched areas. Segments 7a–7b of the inter-mat line 7 extending from the point 7a in the mat H to the point 7b near the bundle 5c of vertical power supply lines are formed by conductors in the first conductor layer on a space extending between the ground lines 6a in the horizontal direction along the division region 40. The segments 7b-7c from the point 7b to the point 7c are also formed by the conductors in the first conductor layer and they extend under the second layer conductor portion of the bundle 6a of ground lines. The segments 7c-7d from the point 7c to the point 7d in the mat N are formed by the conductors in the second layer to cross over the bundle 5b of power supply lines in the horizontal direction on the division region 40.

The inter-mat line 7 which connects the mat E to the mat M is provided not only in a space on the division region 40 but also in a space on the first additional division region 40a. The segments 7e-7f extending from the point 7e in the mat E to the point 7f on the first additional division region 40a are formed by the conductors in the second layer to cross over the bundle 5c of vertical power supply lines. The segments 7f-7g between the points 7f and 7g are formed by the conductors in the first layer and extend under the second layer conductor portion of the bundle 6a of ground lines in the horizontal direction along the division region 40. The segments 7g-7h between the points 7g and 7h are formed by the conductors in the second layer to cross over the bundle 6b of vertical ground lines. The segments 7h-7i from the point 7h to the point 7i in the mat M are formed by the conductors in the first layer.

Thus, most of the first layer conductor portions of the inter-mat lines 7 are covered with the shield electrodes 70.

Referring to FIGS. 7A, 7B, 7C, 7D and 7E, sections taken along the line X—X in FIG. 2 are schematically illustrated with various shield electrode structures.

Figure 7A:
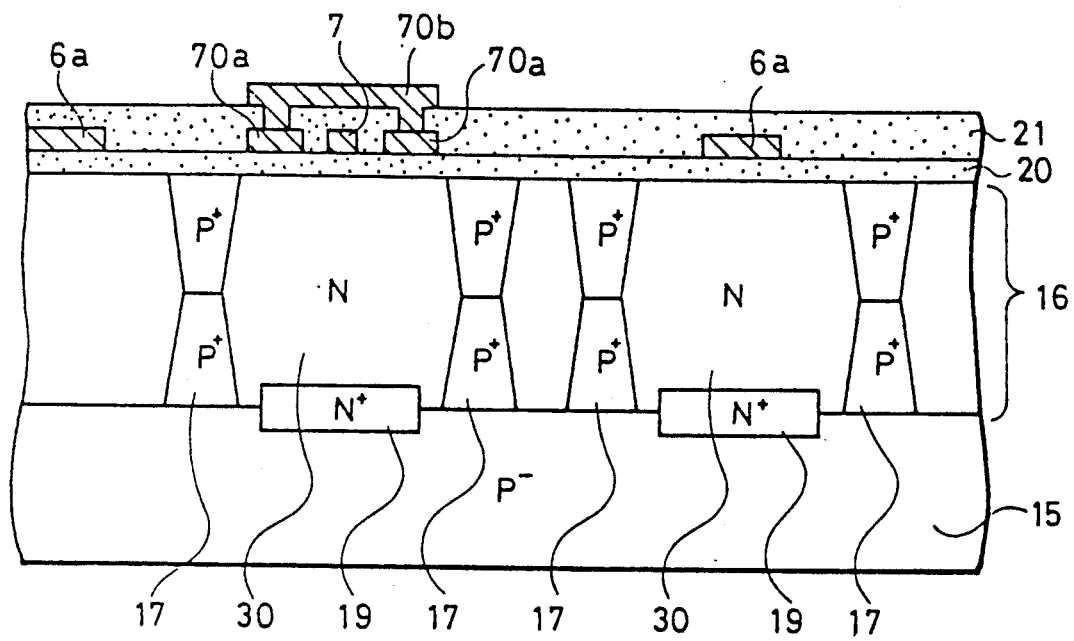
FIGS. 7A, 7B, 7C, 7D and 7E are sectional views schematically illustrating various electrode structures according to the present invention.

Referring to FIG. 7A, an inter-mat line 7 is formed above one dummy island 30 and a first insulating layer 20 is provided therebetween. Shield electrodes 70a of a first layer are provided on both sides of the inter-mat line. The inter-mat line 7 and the shield electrodes 70a of the first layer are covered with a second insulating layer 21. A shield electrode 70b of a second layer is formed on the second insulating layer 21 to further cover the inter-mat line 7 and the shield electrodes 70a of the first layer. The shield electrode 70b of the second layer is connected with the shield electrodes 70a of the first layer through openings in the second insulating layer 21. Those shield electrodes 70a and 70b may be connected to a predetermined potential such as a power supply potential or a ground potential. The shield electrodes 70a and 70b function to protect the inter-mat line 7 from interference due to undesirable radiation from above or from the lateral sides.

Figure 7B:
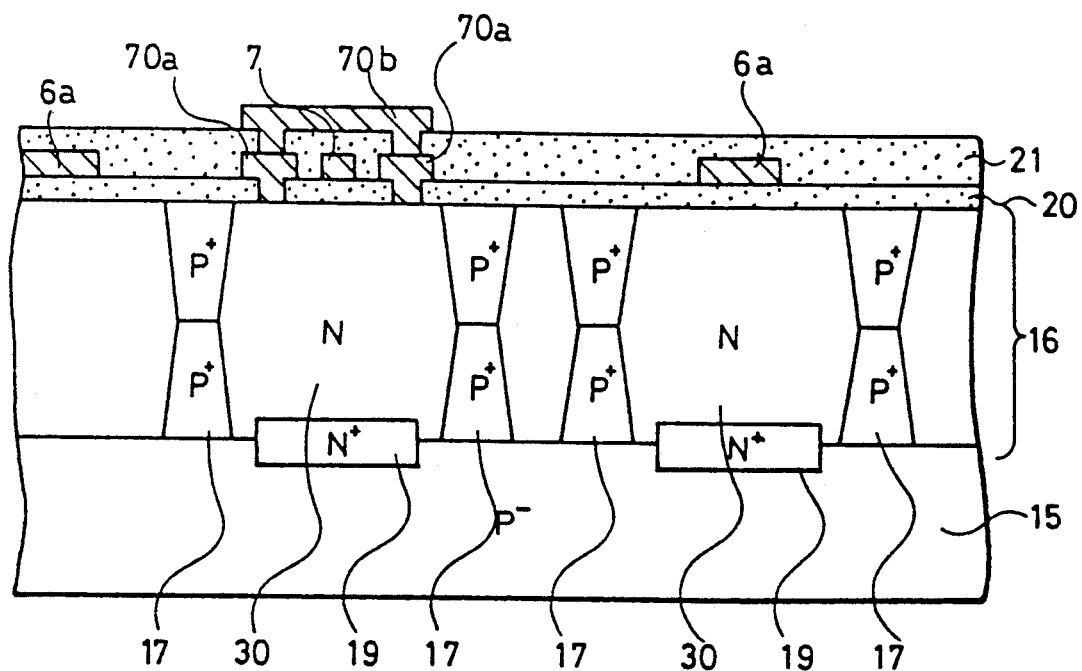

The shield electrode structure in FIG. 7B is similar to that in FIG. 7A, except that the shield electrodes 70a of the first layer are in ohmic contact with an N dummy island 30 through openings in the first insulating layer 20. The dummy island 30 shields the lower surface of the inter-mat line 7 so that the inter-mat line 7 can be protected in the same manner as in the case of a single-core shielded wire. In FIG. 7B, the shield electrodes 70a and 70b may be connected to the power supply potential.

Figure 7C:
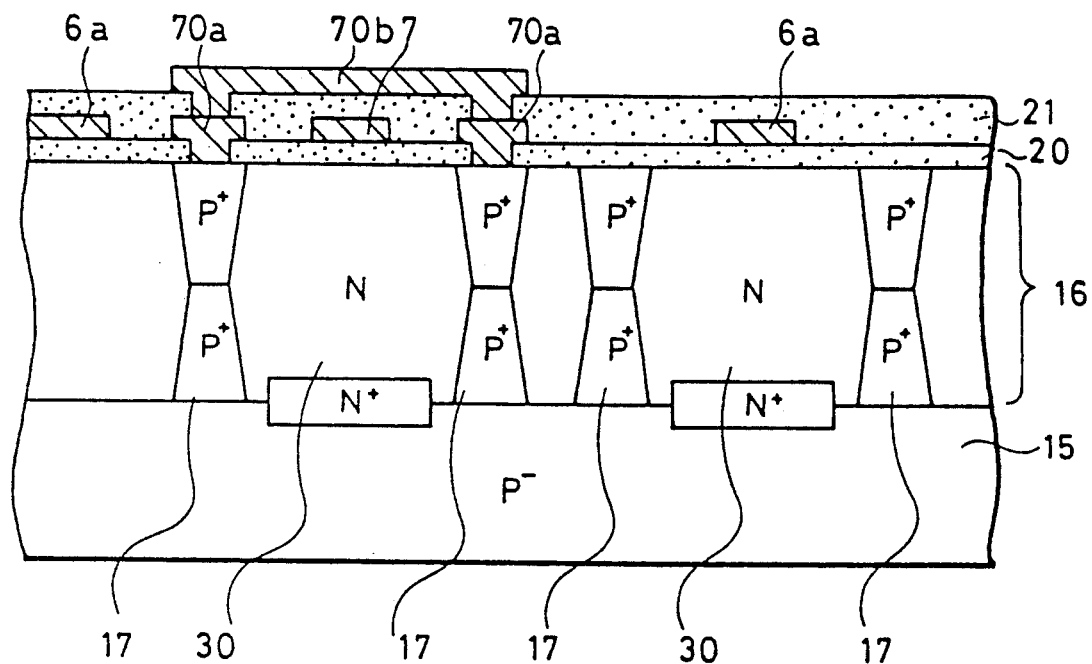

The shield electrode structure in FIG. 7C is similar to that in FIG. 7B, except that the shield electrodes 70a of the first layer are in ohmic contact with the P+ isolation regions 17 through openings in the first insulating layer 20. Those P+ isolation regions 17 and the P− substrate 15 function as a shield electrode for the lower surface of the inter-mat line 7. In FIG. 7C, the shield electrodes 70a and 70b may be connected to the ground potential.

Figure 7D:
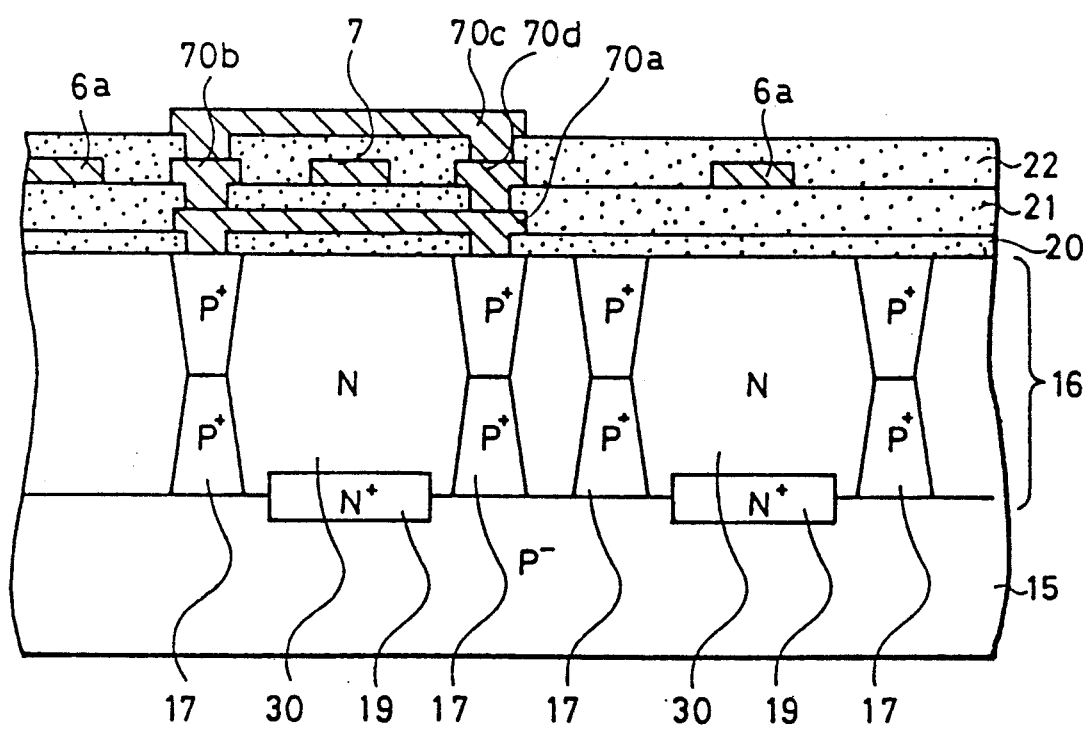

The shield electrode structure in FIG. 7D is similar to that in FIG. 7C, except that it includes shield electrodes 70a, 70b and 70c of three layers. The shield electrode 70a of the first layer covers one dummy island 30 and it is in ohmic contact with P+ isolation regions 17 through openings in the first insulating layer 20. The shield electrode 70a of the first layer is covered with the second insulating layer 21. The inter-mat line 7 is formed on the second insulating layer 21 above the shield electrode 70a of the first layer. The shield electrodes 70b of the second layer formed on both sides of the inter-mat line 7 are connected to the shield electrode 70a of the first layer through openings in the second insulating layer 21. The inter-mat line 7 and the shield electrodes 70b of the second layer are covered with a third insulating layer 22. The shield electrode 70c of the third layer formed on the third insulating layer 22 covers the inter-mat line 7 and it is connected to the shield electrodes 70b of the second layer through openings in the third insulating layer 22. The shield electrode 70a of the first layer shields the lower surface of the inter-mat line 7 and it may be formed of polysilicon. In FIG. 7D, the shield electrodes 70a, 70b, 70c may be connected to the ground potential.

Figure 7E:
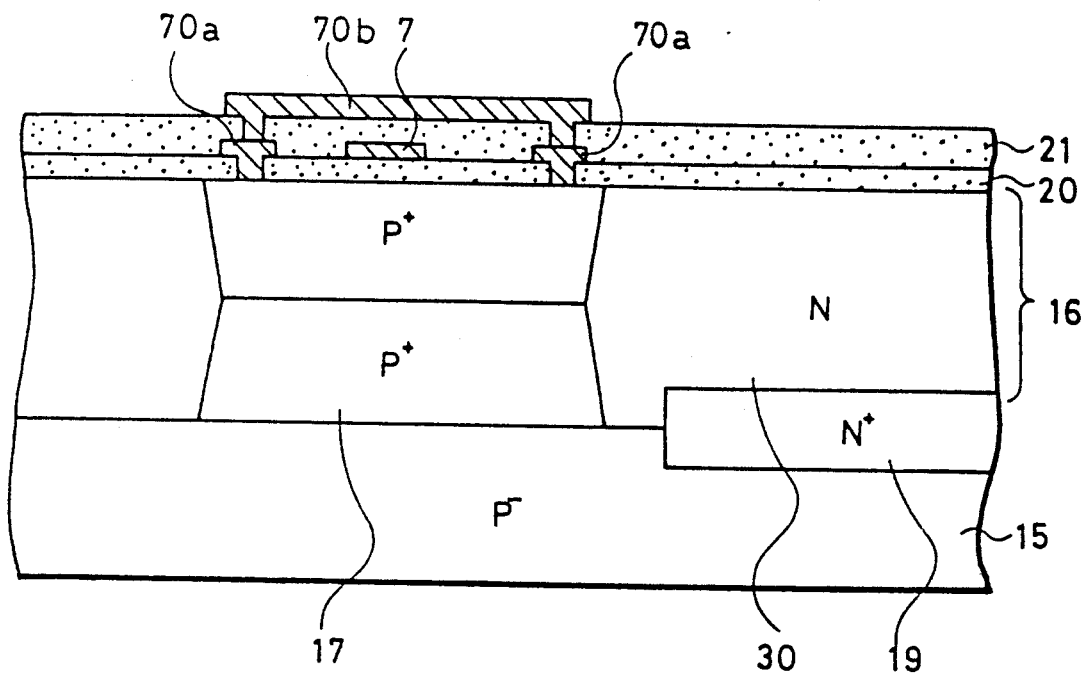

The shield electrode structure in FIG. 7E is similar to that in FIG. 7B, except that the inter-mat line 7 and the shield electrodes 70a, 70b are formed above the P+ isolation region 17, not above an N dummy island. The P+ isolation region 17 shields the lower surface of the inter-mat line 7. In FIG. 7E, the shield electrodes 70a, 70b may be connected to the ground potential. Shield electrodes of three layers as shown in FIG. 7D may be formed above the P+ isolation region 17.

Although each of the above described shield electrode structures in FIGS. 7A to 7D is applied to the portion on the division region 40, it is needless to say applicable to the portions on the additional division regions 40a and 40b.

Figure 8A:
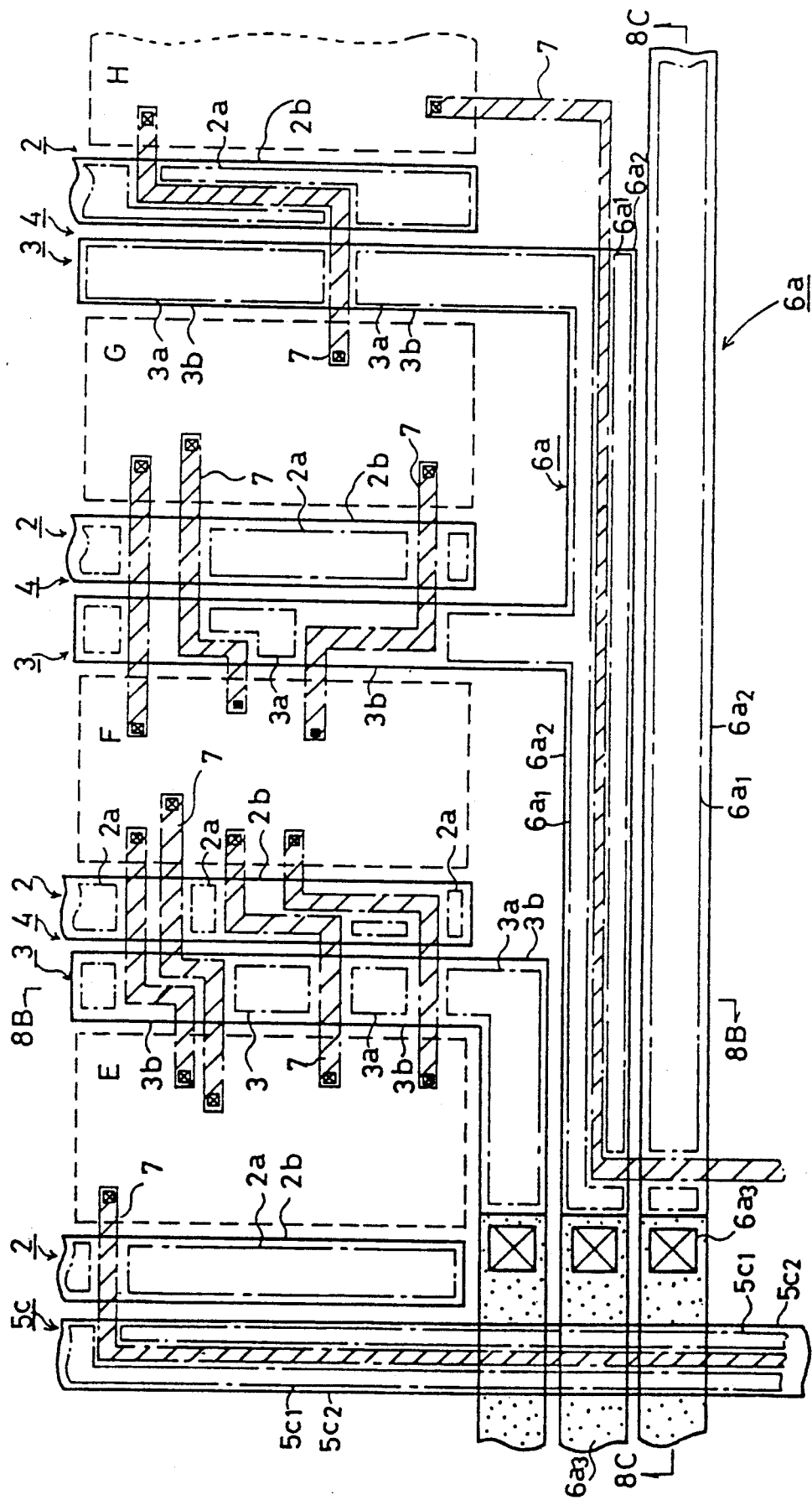
FIG. 8A is a schematic partial top view of a semiconductor IC according to another embodiment of the present invention.
Figure 8B:
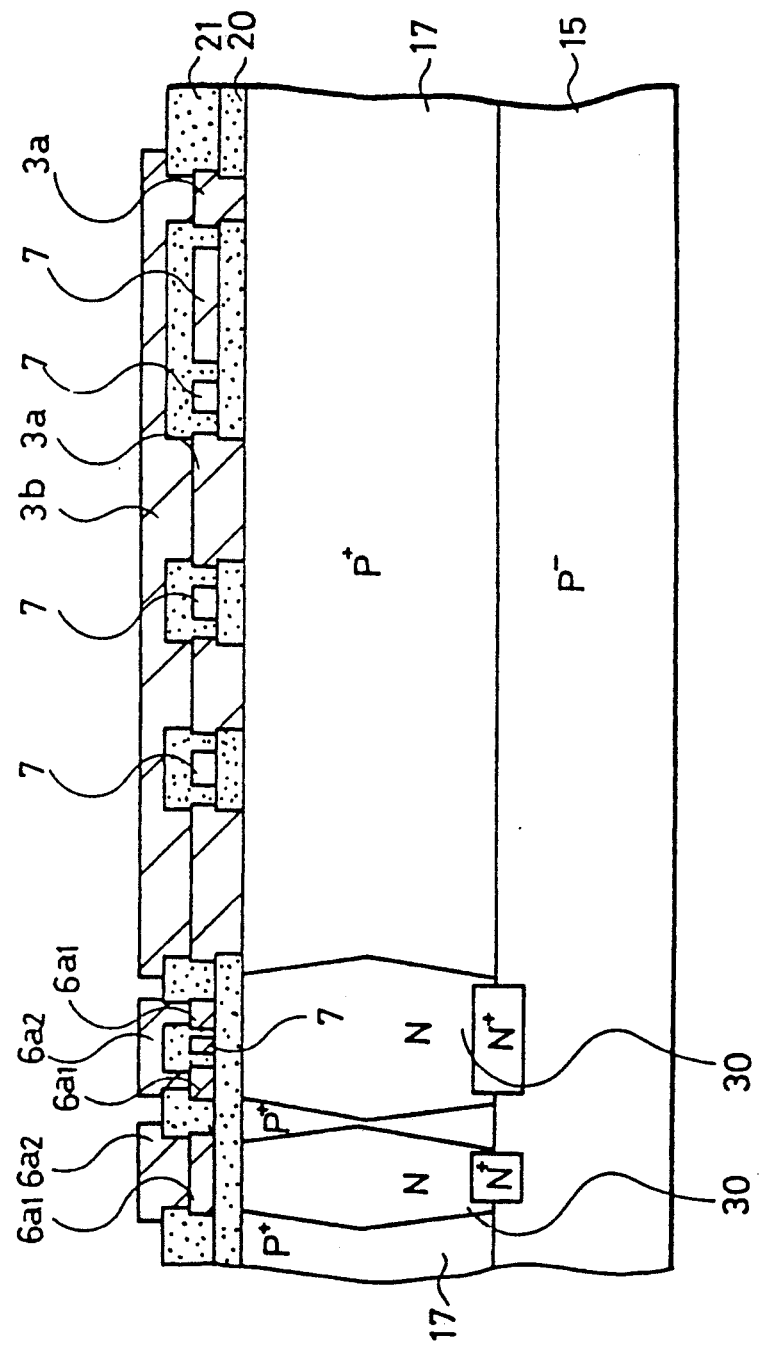
FIG. 8B is a sectional view taken along the line 8B—8B in FIG. 8A.
Figure 8C:
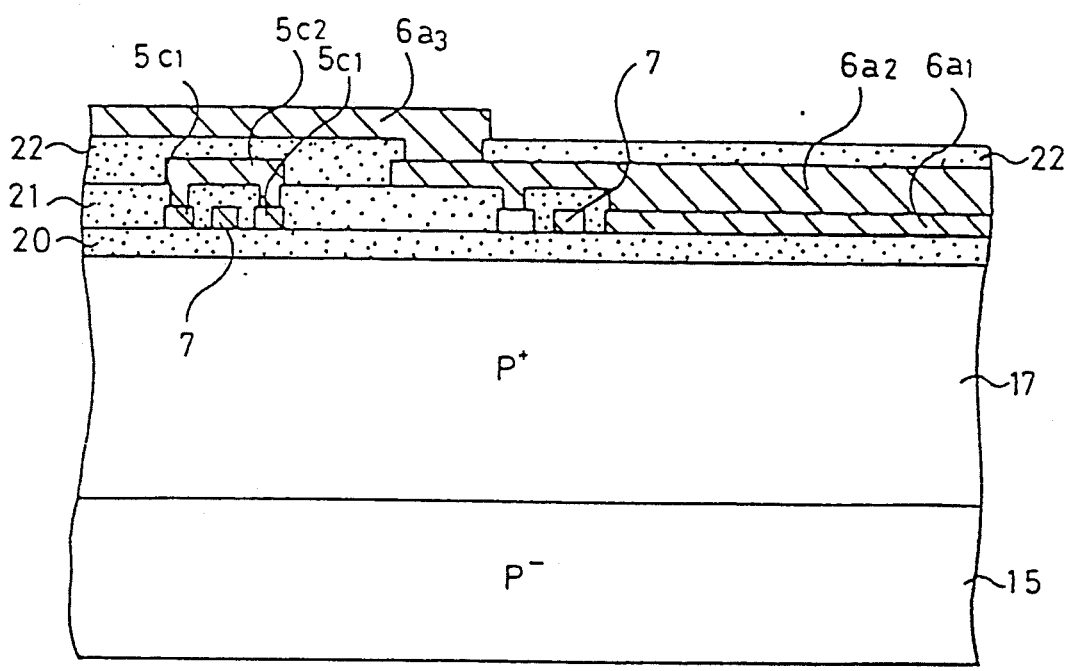
FIG. 8C is a sectional view taken along the line 8C—8C in FIG. 8A.

FIG. 8A is a schematic partial top view of another embodiment of the present invention and FIGS. 8B and 8C are schematic sectional views taken along the lines 8B—8B and 8C—8C in FIG. 8A, respectively. As can be seen from those figures, the power supply lines 2, 5c and the ground lines 3, 6a include respectively conductors 2a, 5c1, 3a, 6a1 of the first layer and conductors 2b, 5c2, 3b, 6a2 of the second layer. Those conductors 2a, 5c1, 3a, 6a1 of the first layer contact the corresponding conductors 2b, 5c2, 3b, 6a2 of the second layer through the openings having the substantially same forms in the second insulating layer 21. Thus, the conductors 2a, 5c1, 3a, 6a1 of the first layer are cut off in desired regions and the continuities of the power supply lines 2, 5c and the ground lines 3, 6a are maintained by the corresponding conductors 2b, 5c2, 3b, 6a2 of the second layer.

The regions where the conductors 2a, 5c1, 3a, 6a1 of the first layer of the power supply lines 2, 5c and ground line 3, 6a are cut permit the inter-mat line 7 to pass therethrough. In that case, the power supply lines 2, 5c and ground lines 3, 6a can function as shield electrodes for the inter-mat line 7. Particularly, the power supply line 5c and the ground line 6a shield the elongate regions of the inter-mat lines 7, making it unnecessary to provide additional areas for arranging those inter-mat lines 7.

The inter-mat lines 7 formed by the conductors of the first layer are connected to the circuit elements integrated in the mats through the contact regions shown by the small marks x in FIG. 8A. The ground line 6a is connected to the conductor 6a3 of the third layer to cross over the power supply line 5c, as can be clearly seen from FIG. 8C.

Referring to FIG. 9, a schematic partial top view of a further embodiment of the present invention is shown. In this figure, each power supply line includes conductors 2a, 2b, 2c of three layers. The conductors 2a and 2b of the first and second layers exist in the smudged areas and they contact through the openings having the substantially same form in the second insulating layer. The conductors 2b of the second layer contact the corresponding conductors 2c of the third layer shown by the solid lines through the openings having the substantially same form in the third insulating layer. Similarly, each ground line 3 includes conductors 3a, 3b, 3c of three layers.

The regions where the conductors 2a and 2b of the first and second layers of the power supply line 2 are cut make it possible for the inter-mat line 7 to pass therethrough. The inter-mat line 7 may include not only conductors 7a of the first layer shown by the single-dot chain lines but also conductors 7b of the second layer shown by the double-dot chain lines. The conductors 7a and 7b of the first and second layers of the inter-mat lines 7 are connected to each other through the openings in the second insulating layer shown by the marks x in the regions of the power supply lines 2. Thus, 2-level crossing between the inter-mat lines 7 in the regions of the power supply lines 2 can be accomplished.

Similarly, each ground line 3 includes conductors 3a, 3b, 3c of three layers and 2-level crossing between the inter-mat lines 7 in the regions of the ground line 3 can be accomplished.

In general, since the power supply lines 2 and the ground lines 3 are formed by conductors having large widths, it is possible to provide four to ten narrow inter-mat lines 7 in the regions of the power supply lines 2 or the ground lines 3 along the longitudinal direction. Thus, free 2-level crossing between the inter-mat lines 7 can be accomplished in the regions of the power supply lines 2 and the ground lines 3 and accordingly the circuit pattern in the mats can be changed without being limited by the crossing of the inter-mat lines 7.

Figure 1A:
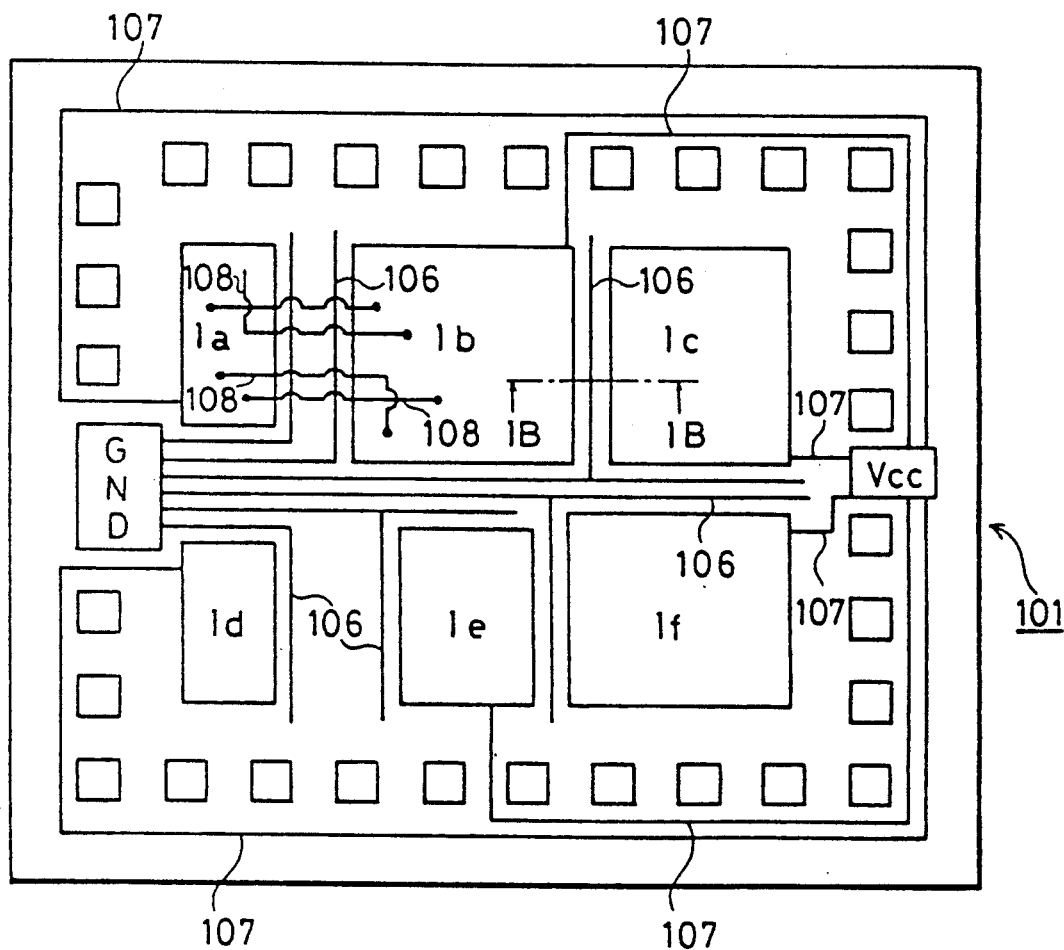
FIG. 1A is a schematic top view showing an example of a pattern layout of a conventional semiconductor IC.
Figure 1B:
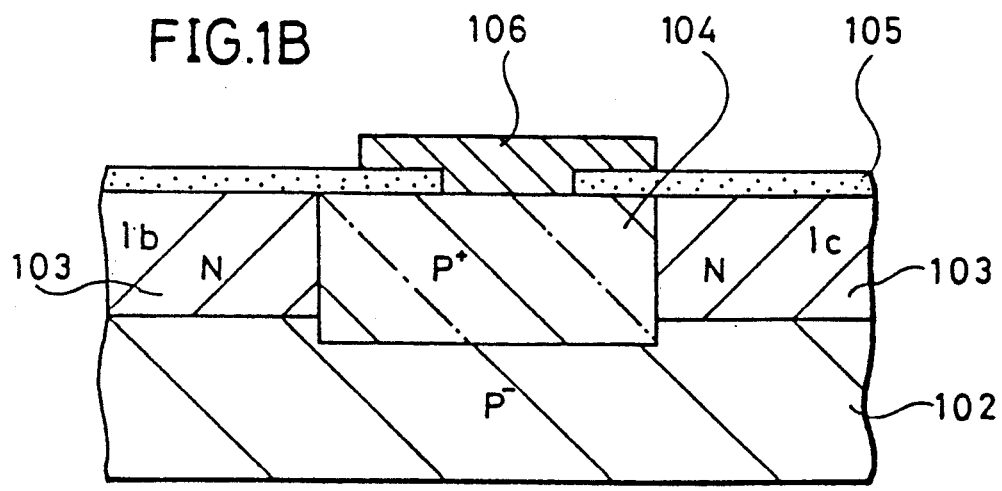
FIG. 1B is a schematic sectional view taken along the line 1B—1B in FIG. 1A.

It is understood that the structure of the power supply lines 2, 5c and ground lines 3, 6a shown in FIGS. 8A to 8C and FIG. 9 is also applicable to the power supply lines 107 and ground lines 106 of the conventional semiconductor IC as shown in FIG. 1A. In this case, the interconnection lines 108 between the circuit blocks correspond to the inter-mat lines 7.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit, comprising:
a semiconductor chip;
a plurality of circuit blocks formed on said semiconductor chip, said circuit blocks each having semiconductor circuit elements;
distribution line means for distributing power to said semiconductor circuit elements and for grounding said circuit blocks, said distribution line means including first and second power supply lines for distributing said power and which are in electrical contact with each other, said distribution line means including first and second ground lines for grounding said circuit blocks and which are in electrical contact with each other; and
inter-block line means for electrically interconnecting said circuit blocks and being electrically insulated from said distribution line means, said inter-block line means including inter-block lines, said first power supply lines and said first ground lines being cut at desired locations for enabling said inter-block lines to pass therethrough, continuity of power distribution through said first power supply lines being maintained by said second power supply lines because of said electrical contact therebetween, continuity of grounding through said first ground lines being maintained by said second ground lines because of said electrical contact therebetween.

2. A circuit as in claim 1, wherein said circuit blocks each performs a different function.

3. A semiconductor integrated circuit, comprising:
a semiconductor chip;
a plurality of circuit blocks formed on said semiconductor chip, said circuit blocks each having semiconductor circuit elements;
distribution line means for distributing power to said semiconductor circuit elements and for grounding said circuit blocks, said distribution line means including first, second and third power supply lines for distributing said power, said second power supply lines being in electrical contact with and between said first and third power supply lines, said distribution line means including first, second and third ground lines for grounding said circuit blocks, said second ground lines being in electrical contact with and between said first and third ground lines; and
inter-block line means for electrically interconnecting said circuit blocks and being electrically insulated from said distribution line means, said inter-block line means including first and second inter-block lines, said first power supply lines and said first ground lines being on a first insulating layer and being cut at desired locations for enabling said first inter-block lines to pass therethrough, said second power supply lines and said second ground lines being on a second insulating layer and being cut at desired locations for enabling said second inter-block lines to pass therethrough, whereby bi-level crossing of said inter-block lines is attainable via said cuts at said desired locations.

4. A circuit as in claim 3, wherein said circuit blocks each performs a different function.

* * * * *